(12) United States Patent
Forlenza et al.

(10) Patent No.: US 7,934,134 B2
(45) Date of Patent: Apr. 26, 2011

(54) METHOD AND APPARATUS FOR PERFORMING LOGIC BUILT-IN SELF-TESTING OF AN INTEGRATED CIRCUIT

(75) Inventors: Donato O. Forlenza, Hopewell Junction, NY (US); Orazio P. Forlenza, Hopewell Junction, NY (US); Bryan J. Robbins, Beavercreek, OH (US); Phong T. Tran, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 279 days.

(21) Appl. No.: 12/133,830

(22) Filed: Jun. 5, 2008

(65) Prior Publication Data

US 2009/0307548 A1    Dec. 10, 2009

(51) Int. Cl.
*G01R 31/28* (2006.01)

(52) U.S. Cl. ........ 714/733; 714/726; 714/727; 714/729; 714/734

(58) Field of Classification Search .................. None
See application file for complete search history.

(56) References Cited

U.S. PATENT DOCUMENTS

| | | | |
|---|---|---|---|
| 5,229,999 A * | 7/1993 | Cushing et al. | 714/703 |
| 5,396,498 A * | 3/1995 | Lestrat et al. | 714/703 |
| 5,428,624 A * | 6/1995 | Blair et al. | 714/727 |
| 6,694,454 B1 | 2/2004 | Stanley | |
| 7,058,869 B2 | 6/2006 | Abdel-Hafez et al. | |
| 7,146,584 B2 * | 12/2006 | Varney | 716/4 |
| 7,461,315 B2 * | 12/2008 | Gunda et al. | 714/738 |
| 2006/0253751 A1 * | 11/2006 | Gunda et al. | 714/724 |
| 2007/0168803 A1 * | 7/2007 | Wang et al. | 714/726 |
| 2008/0115026 A1 | 5/2008 | Dieffenderfer et al. | |

OTHER PUBLICATIONS

Nandu Tendolkar1, Dawit Belete1, Bill Schwarz1, Bob Podnar1, Akshay Gupta3, Steve Karako1, Wu-Tung Cheng2, Alex Babin2, Kun-Han Tsai2, Nagesh Tamarapalli2, Greg Aldrich2 Improving Transition Fault Test Pattern Quality through At-Speed Diagnosis, 2006.*

* cited by examiner

*Primary Examiner* — Cynthia Britt
*Assistant Examiner* — Guerrier Merant
(74) *Attorney, Agent, or Firm* — Dillon & Yudell LLP

(57) ABSTRACT

A method for performing a logical built-in self-test of an integrated circuit is disclosed. The method includes performing a flush and scan test to determine whether the scan chains function correctly. If one of the scan chains does not function correctly, the logical built-in self-test is terminated. If each of the scan chains functions correctly, a structural test of the design-for-test logic supporting LBIST is performed to determine whether the LBIST design-for-test logic functions correctly. If the LBIST design-for-test logic does not function correctly, the logical built-in self-test is terminated. If the LBIST design-for-test logic functions correctly, a level sensitive scan design test of the functional combinational logic is performed using the logic supporting LBIST design-for-test to determine if the integrated circuit functions correctly.

15 Claims, 3 Drawing Sheets

METHOD AND APPARATUS FOR PERFORMING LOGIC BUILT-IN SELF-TESTING OF AN INTEGRATED CIRCUIT

BACKGROUND OF THE INVENTION

1. Technical Field

The present invention relates to device testing in general, and in particular, to a method and apparatus for performing logic built-in self-testing of an integrated circuit.

2. Description of Related Art

One of the problems with semiconductor test techniques is associated with the usage of automatic test equipment (ATE) to apply the test patterns at the device's external inputs and measure the responses at the device's external outputs. This approach does not provide a means to adequately detect all of the device's internal defects. Direct access to the internal structures of a device is necessary. This need has led to the development of design-for-test (DFT) and logic built-in self-test (LBIST) techniques and methods.

DFT techniques include design rules and constraints aimed at increasing the testability of a design through increased internal test controllability and observability. A well-known form of DFT is level sensitive scan design (LSSD), which involves modifying the internal storage elements of a device such that, in a test mode, the storage elements form individual stages of a shift register for scanning in test data stimuli and scanning out test responses.

The LBIST approach was developed from the fact that much of the electronics of a circuit tester is semiconductor-based, just like the products that are being tested. Since many limitations in ATE-based testing are a consequence of the interface to the device-under-test, the LBIST approach moves many of the test equipment functions (which are already semiconductor-based) into the products-under-test to eliminate the complex interfacing.

Logic built-in self-test (LBIST) is used for manufacturing test at all package levels and for system self-test. An LBIST implementation generates test vectors to detect potential faults in the device-under-test while the output responses are measured at the primary outputs. LBIST adds a pseudo-random pattern generator (PRPG) to the inputs and a multiple-input shift register (MISR) to the outputs of the device's internal storage elements, which are arranged to form the scan chains disclosed above. Pseudo-random patterns are applied to the logic-under-test by scanning the pseudo-random pattern into STUMPS channels (known as channel fill) and executing a test sequence that consists of scan and functional clock cycles. An LBIST controller generates all necessary waveforms for repeatedly loading pseudorandom patterns into the scan chains, initiating a functional cycle, and logging the captured responses out into the MISR. The MISR compresses the accumulated responses into a code known as a signature. Any corruption in the final signature at the end of the test indicates a defect in the chip.

The DFT logic supporting LBIST tests (LBIST DFT logic) of a device-under-test may have a fault just like any other logic of the device. During manufacturing test, the LBIST DFT logic is used to test the functional logic of the device-under-test. Therefore, it is essential that the LBIST DFT logic is operational prior to any LSSD test application protocols or the test will fail. In the prior art, LBIST DFT logic is not tested prior to LSSD test application protocols. As a result, when a device-under-test fails, a tester does not know if the LBIST DFT logic or the functional logic of the device-under-test is faulty. Furthermore, if the LBIST DFT logic was faulty, then performing the LSSD test application protocols is unnecessary. Given the dramatic increase in density of VLSI devices and overall market trends for 3D integration and systems-on-a-chip, eliminating unnecessary LSSD tests would result in significant test time reduction.

SUMMARY OF THE INVENTION

In accordance with a preferred embodiment of the present invention, a flush and scan test is performed to determine whether each of a set of scan chains functions correctly. If one of the scan chains does not function correctly, the logical built-in self-test is terminated. If each of the of scan chains functions correctly, a structural test of the LBIST design-for-test logic is performed to determine whether the LBIST design-for-test logic functions correctly. If the LBIST design-for-test logic does not function correctly, the logical built-in self-test is terminated. If the LBIST design-for-test logic functions correctly, a level sensitive scan design test of the functional combinational logic is performed using the logic supporting LBIST design-for-test to determine if the integrated circuit functions correctly.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
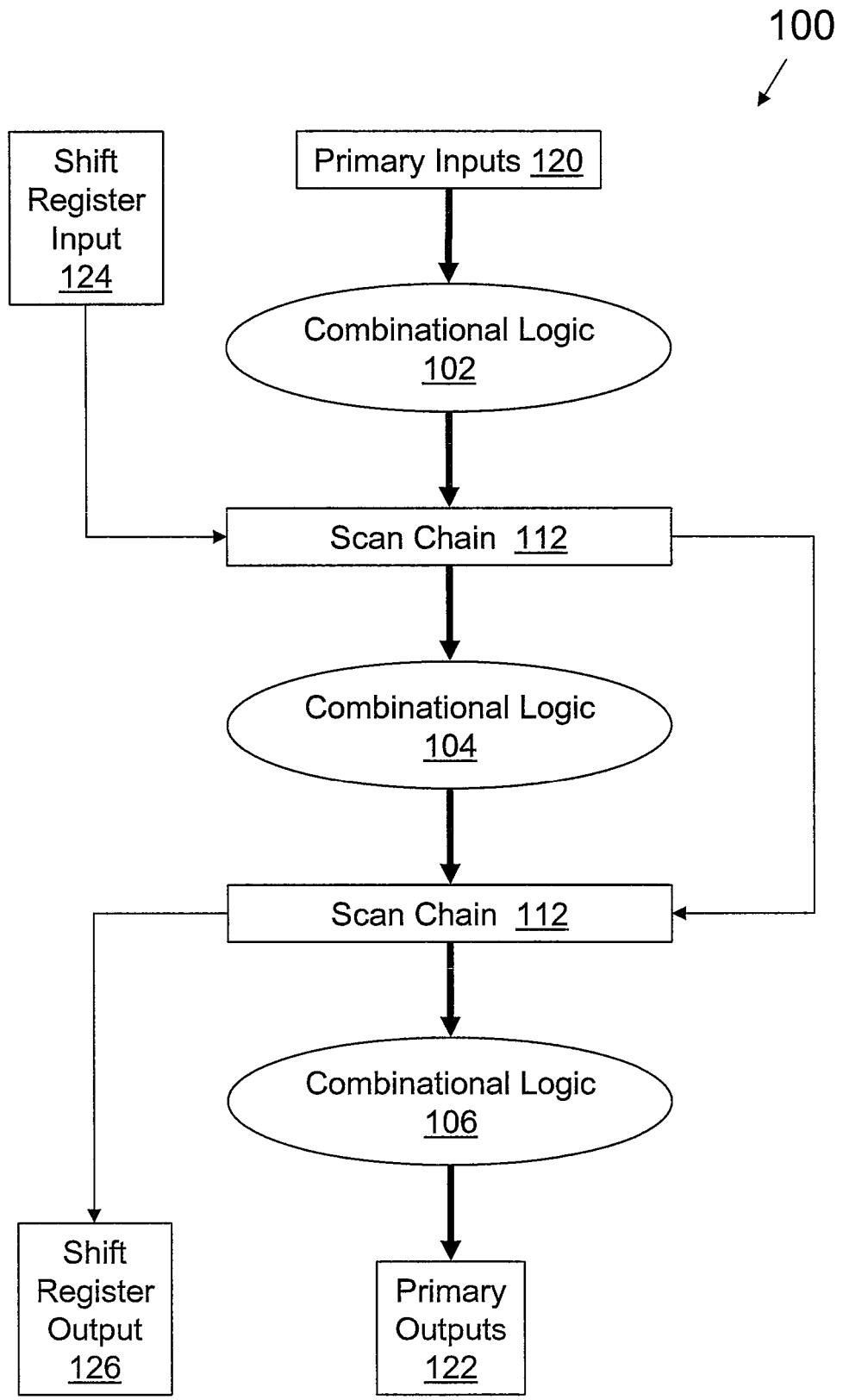
FIG. 1 is a block diagram of an integrated circuit in an LSSD configuration in which a preferred embodiment of the present invention may be incorporated.

With reference now to the drawings, and in particular to FIG. 1, there is illustrated a block diagram of integrated circuit 100 including design-for-test (DFT) logic in which a preferred embodiment of the present invention may be incorporated. Within integrated circuit 100, DFT logic is implemented in a level-sensitive scan design (LSSD). Most of the storage elements of the device, such as latches or registers, are concatenated into one or more of scan chains, such as scan chain 112. Other storage elements that are not part of the scan chains, including memory or other special macros, are isolated and tested independently. Combinational logic 102-106 is internally connected to the storage elements of scan chain 112. When integrated circuit 100 is operating in functional mode, signals applied at primary inputs (PIs) 120 are processed and output at primary outputs 122. Scan chain 112 can be accessed externally via serial input 124 and serial output 126. LSSD thereby ensures that all logic feedback paths are gated by one or more of the storage elements in scan chains 112-114, thereby simplifying a sequential logic design into subsets of combinational logic sections (combinational logic 102-106).

Figure 2:
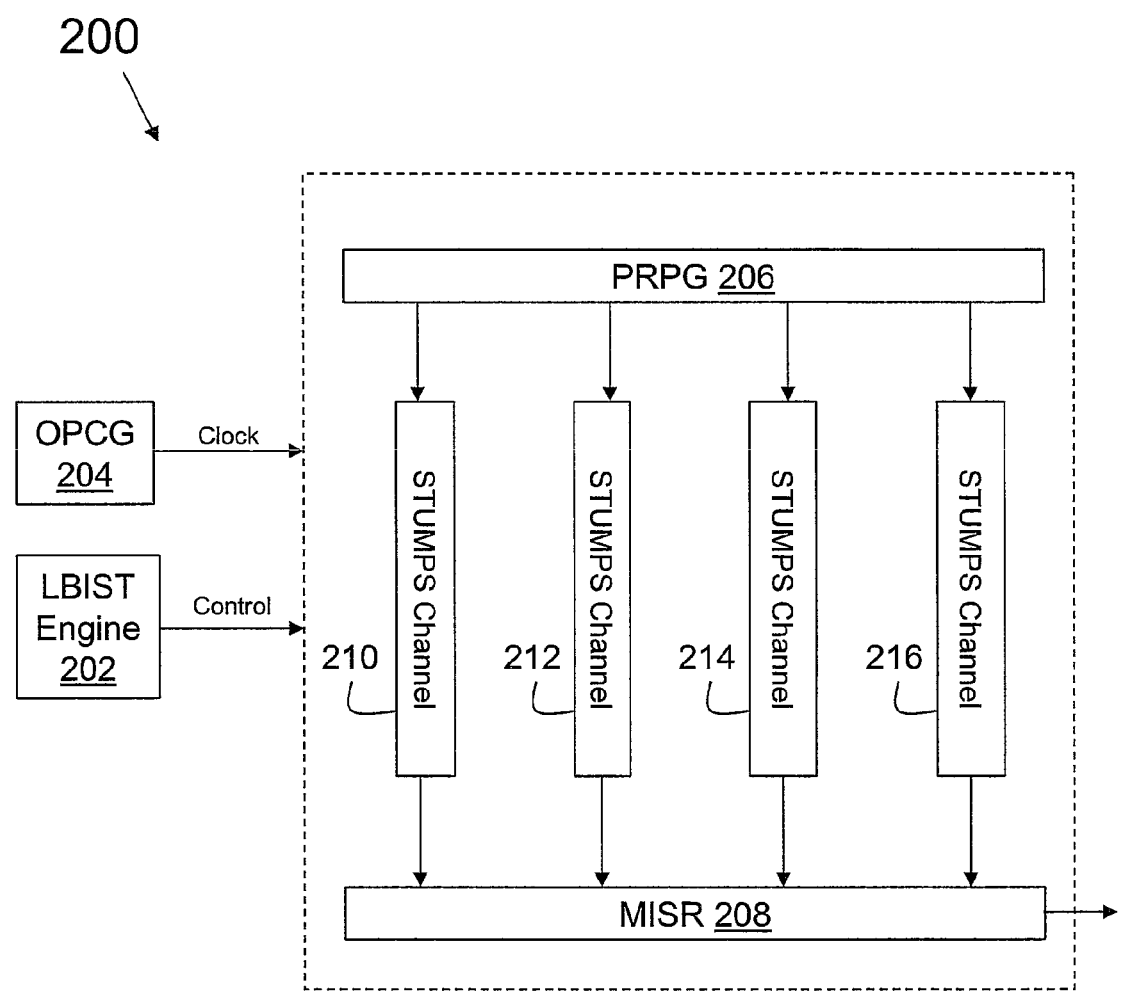
FIG. 2 is a block diagram of design-for-test logic within an integrated circuit configured for logic built-in self testing, in accordance with a preferred embodiment of the present invention.

With reference now to FIG. 2, there is depicted a block diagram of DFT logic 200 within integrated circuit 100 from FIG. 1, in accordance with a preferred embodiment of the present invention. As shown, DFT logic 200 is configured into LBIST mode configuration to support LBIT testing. Pseudo-random pattern generator (PRPG) 206 provides the test stimuli for the combinational logic being tested. A linear feedback shift register (LFSR) can be used as a pseudo-random pattern generator. Multiple input signature register (MISR) 208 is used to generate a unique signature representing the responses from the combinational logic. Ideally, the signature for each failing device-under-test is different from the signature of a known-good device after a predefined number of test cycles.

Scan chain 112 in the LBIST test mode is partitioned into several STUMPS channels 210-216 of approximately the same length. STUMPS channels 210-216 are loaded serially for each LBIST test. Pseudo-random data from PRPG 206 are loaded in parallel into each STUMPS channel and are used a test stimuli. The states of all latches in STUMPS channels 210-216 are unloaded serially into MISR 208, forming a signature representing compressed data. Each LBIST test cycle requires, in addition to the loading and unloading of STUMPS channels 210-216, a timed application of system clocks to launch the test vector from the latches in STUMPS channels 210-216 through combinational logic 102-104 and capture the resulting response in the receiving latches of STUMPS channels 210-216. The signaling for the LBIST test sequence is controlled by LBIST engine 202. Since a typical system design may consist of several system clocks and various path delays, on-product clock generator (OPCG) 204 may apply the clock test sequence and timing set-up multiple times with difference clock combinations and timings. An LBIST test sequence consists of a relatively large number of load/unload sequences followed by the system clock cycle. At the end of the test interval, the signature in MISR 208 is unloaded and compared to an expected signature. Several signature intervals may be applied to achieve the desired test coverage.

Figure 3:
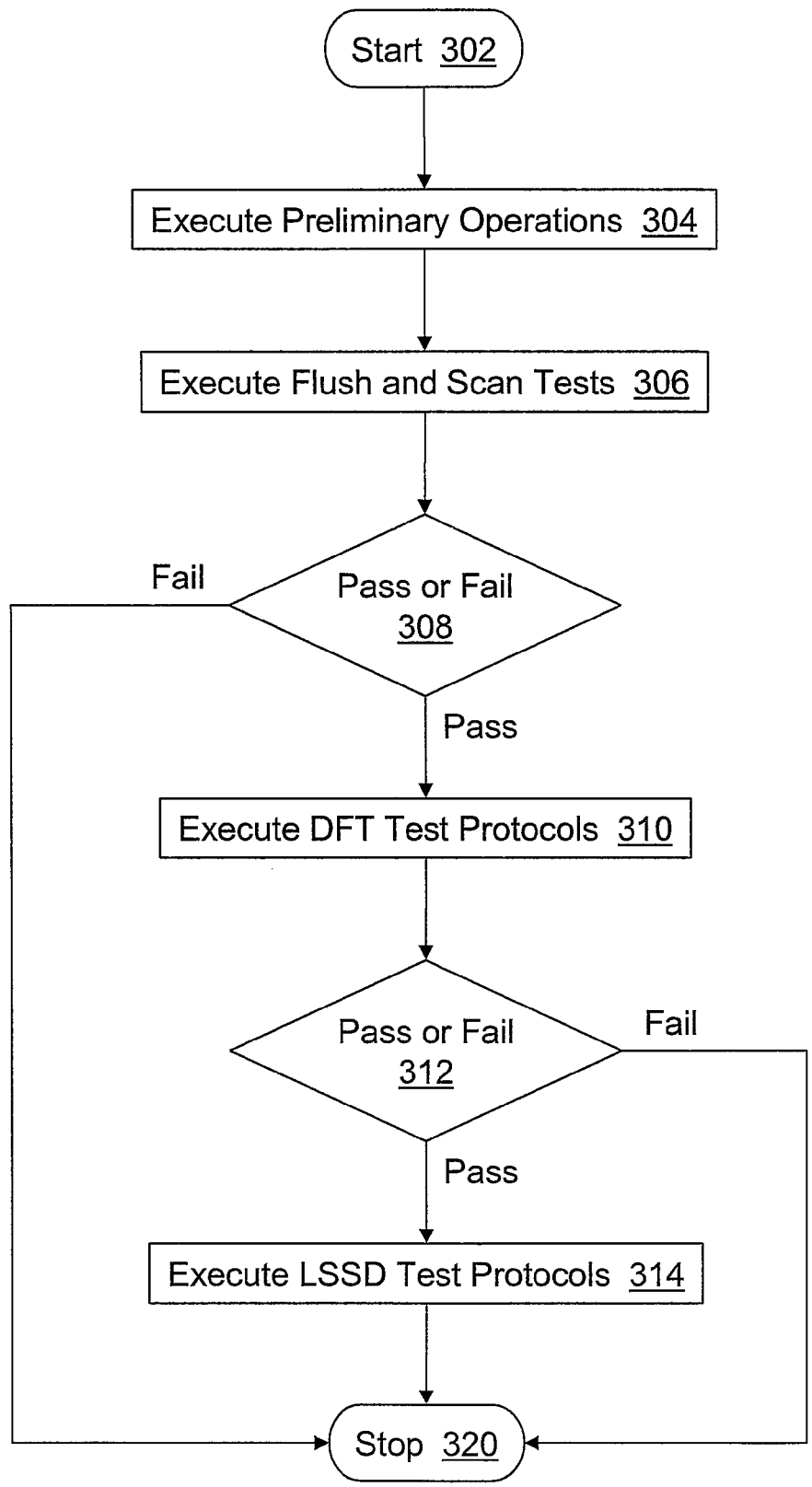
FIG. 3 is a high-level logic flow diagram of an improved method for testing an integrated circuit, in accordance with a preferred embodiment of the present invention.

Referring now to FIG. 3, there is depicted a high-level logic flow diagram of an improved method for testing an integrated circuit, in accordance with a preferred embodiment of the present invention. Starting at block 302, preliminary operations are performed to initialize the test sequence, as shown in block 304. The preliminary operations may include powering up the device-under-test, conducting a probe melt test and executing any parametric tests. Then, a flush and scan test is performed, as depicted in block 306. The flush test is a static test. During the flush test, the scan clocks are held high while a pulse representing a data bit is applied to shift register input 124. After a time interval equal to the accumulated response times of all shift register latches in scan chain 112 has elapsed, the data pulse applied to shift register input 124 is ôflushedö through scan chain 112 and obtained at shift register output 126. The scan test is a dynamic test. In the scan test, a data pulse is applied to shift register input 124 while the scan clocks are pulsed. Scan chain 112 acts as a shift register, passing the data pulse from latch to latch. After an appropriate number of clock pulses are applied, the data pulse should appear at shift register output 126, verifying that data can be properly scanned into and out of scan chain 112. For a device having more than one scan chain, as shown in FIG. 2, each of STUMPS channels 210-216 are tested.

A determination is made whether the device-under-test passed or failed the flush and scan tests, as shown in block 308. If the data pulse is not properly observed at shift register output 126 in either the flush test or the scan test, then the device-under-test fails, and the test terminates at block 320 without any further testing. If the data pulse is properly observed at shift register output 126 in both the flush test and the scan test, then the device-under-test passes to block 308 and the test proceeds to block 310. The flush and scan tests of block 306 verify that a scan chain can properly flush and scan data. However, DFT logic 200 performs other logical functions in addition to the flushing and scanning of data, and these additional functions are not verified by the flush and scan testing of step 306. For example, DFT logic 200 includes LBIST engine 202, PRPG 206, MISR 208, OPCG 204. DFT logic 200 may also include a self-test control macro, STUMPS channel configuration logic, LBIST state machine logic, scan control logic, scan interface logic, selective signature generation (SSG) logic and LBIST done signal logic. If there is a fault in DFT logic 200, then logic built-in self-testing of the functional logic circuits within the integrated circuit using the faulty DFT logic would not produce the desired output responses, even if the functional logic itself did not contain any faults. There is no need to continue testing, and any further testing of the device-under-test unnecessarily increases the overall test time. Therefore, at step 310 a logic DFT test is performed such that each logic block of DFT logic 200 is deterministically tested in a structural test methodology, including any LBIST circuitry that, if faulty, would compromise the actual execution of the LBIST test itself and not produce the desired output responses. The associated DC and AC faults for the functions of DFT logic 200 are targeted for testing. Examples of the targeted DC and AC faults include stuck-at-zero, stuck-at-one, slow-to-rise and slow-to-fall faults. A determination is made whether the device-under-test passes or fails the logic DFT test, as shown in block 312. If a fault is found in DFT logic 200, then the device-under-test fails and the test terminates at block 320 without any further testing. If no fault is found in DFT logic 200, then LBIST testing continues and all LBIST test protocols are executed, as shown in block 314. The testing terminates at block 320.

By terminating the test in response to a determination that DFT logic 200 failed the logic DFT test (at block 310), test time in the manufacturing environment is reduced. An LBIST test interval consists of a relatively large number of load and unload sequences to load test pattern data into and obtain test results from the scan chains. As the length of scan chains increases, so does the time required to perform the load and unload sequences. If DFT logic 200 is not operational or functioning incorrectly, then LBIST test performed using the faulty DFT logic will not result in useful data. Substantial test time reductions may be realized by abandoning LBIST testing in response to determining that the DFT logic is faulty. For example, the number of faults associated with DFT logic 200 that must be tested may be less than 1% of the total number of faults for a particular core/chiplet on a single device-under-test. Hence, applying the method of FIG. 3 is cost efficient and cost productive in terms of test generation cost and tester application time when compared to the overall benefits of test time reduction, improved diagnostic granularity and potential yield adders.

In an alternative embodiment, redundant DFT logic may be provided on a device. The redundant DFT logic is multiplexed with DFT logic 200 so that, in the event DFT logic 200 fails logical testing, the redundant DFT logic can be enabled and tested and faulty DFT logic 200 can be disabled. If the redundant DFT logic passes the logical testing, then LBIST testing can proceed using the redundant DFT logic, thereby potentially increasing chip yield in the case where only DFT logic 200 is faulty and the rest of the logic of the device-under-test is operational. Providing redundant DFT logic is particularly useful as the number of cores or chiplets on a device increase. The greater the number of core or chiplets, the more benefit is achieved in terms of improved test time reduction, potential increase in yield and improved diagnostic granularity.

As has been described, the present invention provides an improved method for performing logic built-in self-testing of integrated circuits.

Those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. Examples of the types of media include recordable type media such as thumb drives, floppy disks, hard drives, CD ROMs, DVDs, etc.

While the invention has been particularly shown and described with reference to a preferred embodiment, it will be understood by those skilled in the art that various changes in form and detail may be made therein without departing from the spirit and scope of the invention.

What is claimed is:

1. A method for performing a logic built-in self-test (LBIST) on an integrated circuit, said method comprising:
   performing a flush and scan test on an integrated circuit having functional combinational logic and a plurality of scan chains selectively driven by design-for-test logic for supporting LBIST, to determine whether or not each of said plurality of scan chains functions correctly;
   in response to a determination that one of said plurality of scan chains does not function correctly, terminating said LBIST;
   in response to a determination that each of said plurality of scan chains functions correctly, performing a structural test on said design-for-test logic to determine whether or not said design-for-test logic functions correctly;
   in response to a determination that said design-for-test logic does not function correctly, terminating said LBIST;
   in response to a determination that said design-for-test logic functions correctly, performing a level sensitive scan design (LSSD) test on said functional combinational logic using said design-for-test logic to determine whether or not said integrated circuit functions correctly.

2. The method of claim 1, wherein said structural test includes testing said design-for-test logic for stuck-at-one faults.

3. The method of claim 1, wherein said structural test includes testing said design-for-test logic for stuck-at-zero faults.

4. The method of claim 1, wherein said structural test includes testing said design-for-test logic for slow-to-rise faults.

5. The method of claim 1, wherein said structural test includes testing said design-for-test logic for slow-to-fall faults.

6. A method for performing a logic built-in self-test (LBIST) on an integrated circuit, said method comprising:
   performing a flush and scan test on an integrated circuit having functional combinational logic and a plurality of scan chains selectively driven by design-for-test logic for supporting LBIST, to determine whether or not each of said plurality of scan chains functions correctly;
   in response to a determination that one of said plurality of scan chains does not function correctly, terminating said LBIST;
   in response to a determination that each of said plurality of scan chains functions correctly, performing a structural test on said design-for-test logic to determine whether or not said design-for-test logic functions correctly;
   in response to a determination that said design-for-test logic does not function correctly,
   disabling said design-for-test logic;
   enabling redundant design-for-test logic;
   performing a structural test on said redundant design-for-test logic to determine whether or not said redundant design-for-test logic functions correctly;
   in response to a determination that said redundant design-for-test logic does not function correctly, terminating said LBIST;
   in response to a determination that said redundant design-for-test logic functions correctly, performing a level sensitive scan design (LSSD) test on said functional combinational logic using said redundant design-for-test logic to determine whether or not said integrated circuit functions correctly; and
   in response to a determination that said design-for-test logic functions correctly, performing a level sensitive scan design (LSSD) test on said functional combinational logic using said design-for-test logic to determine if said integrated circuit functions correctly.

7. The method of claim 6, wherein said structural test includes testing said design-for-test logic for stuck-at-one faults.

8. The method of claim 6, wherein said structural test includes testing said design-for-test logic for stuck-at-zero faults.

9. The method of claim 6, wherein said structural test includes testing said design-for-test logic for slow-to-rise faults.

10. The method of claim 6, wherein said structural test includes testing said design-for-test logic for slow-to-fall faults.

11. A computer-readable medium having a computer program product for performing a logic built-in self-test (LBIST) on an integrated circuit, said computer-readable medium comprising:
    instructions for performing a flush and scan test on an integrated circuit having functional combinational logic and a plurality of scan chains selectively driven by design-for-test logic for supporting LBIST, to determine whether or not each of said plurality of scan chains functions correctly;
    instructions for, responsive to a determination that one of said plurality of scan chains does not function correctly, terminating said LBIST;
    instructions for, responsive to a determination that each of said plurality of scan chains functions correctly, performing a structural test on said design-for-test logic to determine whether or not said design-for-test logic functions correctly;
    instructions for, responsive to a determination that said design-for-test logic does not function correctly, terminating said LBIST; and
    instructions for, responsive to a determination that said design-for-test logic functions correctly, performing a level sensitive scan design (LSSD) test on said functional combinational logic using said design-for-test logic to determine whether or not said integrated circuit functions correctly.

12. The computer-readable medium of claim 11, wherein said structural test includes testing said design-for-test logic for stuck-at-one faults.

13. The computer-readable medium of claim 11, wherein said structural test includes testing said design-for-test logic for stuck-at-zero faults.

14. The computer-readable medium of claim 11, wherein said structural test includes testing said design-for-test logic for slow-to-rise faults.

15. The computer-readable medium of claim 11, wherein said structural test includes testing said design-for-test logic for slow-to-fall faults.

* * * * *